US012604635B2

(12) United States Patent
Zhang

(10) Patent No.: US 12,604,635 B2
(45) Date of Patent: Apr. 14, 2026

(54) DISPLAY SCREEN, ELECTRONIC DEVICE AND MANUFACTURING METHOD

(71) Applicant: GUANGDONG OPPO MOBILE TELECOMMUNICATIONS CORP., LTD., Dongguan (CN)

(72) Inventor: Jianmin Zhang, Dongguan (CN)

(73) Assignee: GUANGDONG OPPO MOBILE TELECOMMUNICATIONS CORP., LTD., Dongguan (CN)

( * ) Notice: Subject to any disclaimer, the term of this patent is extended or adjusted under 35 U.S.C. 154(b) by 446 days.

(21) Appl. No.: 18/304,823

(22) Filed: Apr. 21, 2023

(65) Prior Publication Data

US 2023/0263033 A1     Aug. 17, 2023

Related U.S. Application Data

(63) Continuation of application No. PCT/CN2021/114257, filed on Aug. 24, 2021.

(30) Foreign Application Priority Data

Oct. 22, 2020     (CN) .......................... 202011139129.2

(51) Int. Cl.
*H10K 59/65*          (2023.01)
*H04M 1/02*          (2006.01)
          (Continued)

(52) U.S. Cl.
CPC .......... *H10K 59/65* (2023.02); *H04M 1/0264* (2013.01); *H10K 59/1201* (2023.02);
          (Continued)

(58) Field of Classification Search
CPC .. H10K 59/65; H10K 59/1201; H10K 59/131; H10K 59/8792; H10K 59/70; H10K 59/121; H04M 1/0264; G09G 3/3233
          (Continued)

(56) References Cited

U.S. PATENT DOCUMENTS

| | | | | |
|---|---|---|---|---|
| 2018/0219142 | A1* | 8/2018 | Chen | H10H 20/01335 |
| 2019/0138783 | A1* | 5/2019 | Yang | G06F 3/0412 |

(Continued)

FOREIGN PATENT DOCUMENTS

| | | |
|---|---|---|
| CN | 107230685 | 10/2017 |
| CN | 108711576 | 10/2018 |

(Continued)

OTHER PUBLICATIONS

CNIPA, Decision of Rejection for CN Application No. 202011139129. 2, Jun. 8, 2023.

(Continued)

*Primary Examiner* — Lex H Malsawma
*Assistant Examiner* — Laura M Dykes
(74) *Attorney, Agent, or Firm* — Hodgson Russ LLP

(57)          ABSTRACT

A display screen, an electronic device and a manufacturing method for a display screen are provided. The display screen includes a substrate, multiple first pixel units, multiple second pixel units, and a second driving circuit. Each first pixel unit includes a first light-emitting unit and a first driving circuit configured to drive the first light-emitting unit, the first light-emitting unit is disposed on the first driving circuit and arranged in a first area together of the substrate with the first driving circuit. Each second pixel unit includes a second light-emitting unit, and the second light-emitting unit is arranged in the second area of the substrate. The second driving circuit is configured to drive the second light-emitting unit to emit light. An area of a projection of the first light-emitting unit on the substrate is smaller than an area of a projection of the second light-emitting unit on the substrate.

20 Claims, 8 Drawing Sheets

(51) Int. Cl.

| | |
|---|---|
| *H10K 59/12* | (2023.01) |
| *H10K 59/131* | (2023.01) |
| *H10K 59/80* | (2023.01) |
| *H10K 71/00* | (2023.01) |

(52) U.S. Cl.
CPC ....... *H10K 59/131* (2023.02); *H10K 59/8792* (2023.02); *H10K 71/00* (2023.02)

(58) Field of Classification Search
USPC .......................................................... 257/40
See application file for complete search history.

(56) References Cited

U.S. PATENT DOCUMENTS

| 2020/0074140 A1* | 3/2020 | Li ..................... G06V 40/1318 |
|---|---|---|
| 2020/0312832 A1* | 10/2020 | Chi ......................... H01L 25/18 |
| 2020/0312925 A1 | 10/2020 | Xia et al. |
| 2021/0305078 A1* | 9/2021 | Liang ................... H10H 20/852 |
| 2021/0335913 A1* | 10/2021 | Zhang ................. H10K 59/122 |
| 2021/0408146 A1* | 12/2021 | Ying ................. H10K 59/8792 |

FOREIGN PATENT DOCUMENTS

| CN | 109256399 | | 1/2019 | | |
|---|---|---|---|---|---|
| CN | 109801903 | | 5/2019 | | |
| CN | 109817109 | | 5/2019 | | |
| CN | 109935173 | | 6/2019 | | |
| CN | 109950288 | | 6/2019 | | |
| CN | 110649140 | | 1/2020 | | |
| CN | 110660897 | | 1/2020 | | |
| CN | 110767097 | | 2/2020 | | |
| CN | 110783363 | | 2/2020 | | |
| CN | 110808267 | | 2/2020 | | |
| IN | 110783364 | | 2/2020 | | |
| KR | 20190115973 A | * | 10/2019 | ............ | H01L 33/44 |
| WO | 2020133161 | | 7/2020 | | |

OTHER PUBLICATIONS

CNIPA, First Office Action for CN Application No. 202011139129.
2, Sep. 26, 2022.
WIPO, International Search Report and Written Opinion for PCT/
CN2021/114257, Oct. 29, 2021.
EPO, Search Report for EP Application No. 21881690.8, May 22,
2024.

\* cited by examiner

200

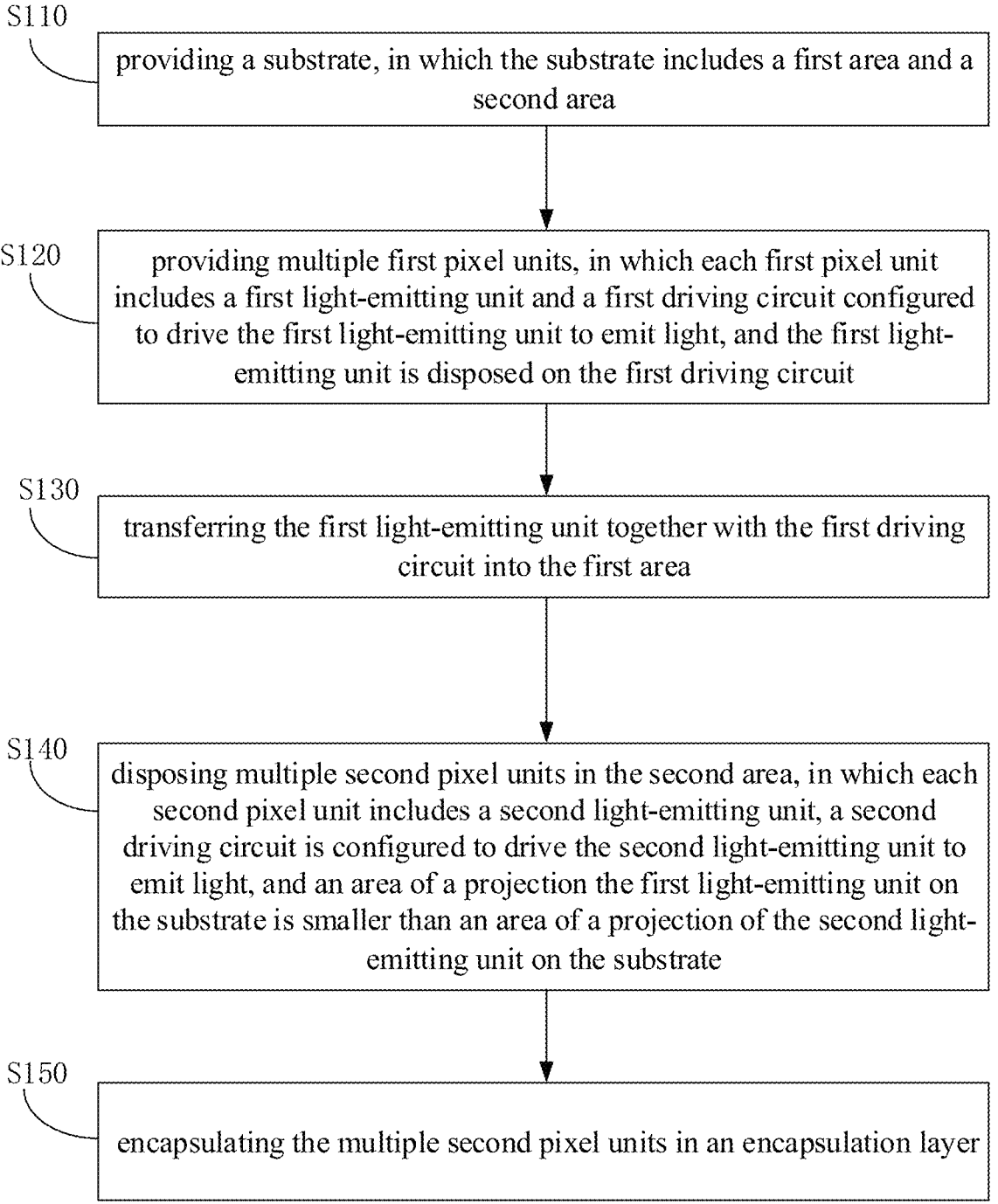

S110 — providing a substrate, in which the substrate includes a first area and a second area S120 — providing multiple first pixel units, in which each first pixel unit includes a first light-emitting unit and a first driving circuit configured to drive the first light-emitting unit to emit light, and the first light-emitting unit is disposed on the first driving circuit S130 — transferring the first light-emitting unit together with the first driving circuit into the first area S140 — disposing multiple second pixel units in the second area, in which each second pixel unit includes a second light-emitting unit, a second driving circuit is configured to drive the second light-emitting unit to emit light, and an area of a projection the first light-emitting unit on the substrate is smaller than an area of a projection of the second light-emitting unit on the substrate S150 — encapsulating the multiple second pixel units in an encapsulation layer

FIG. 8

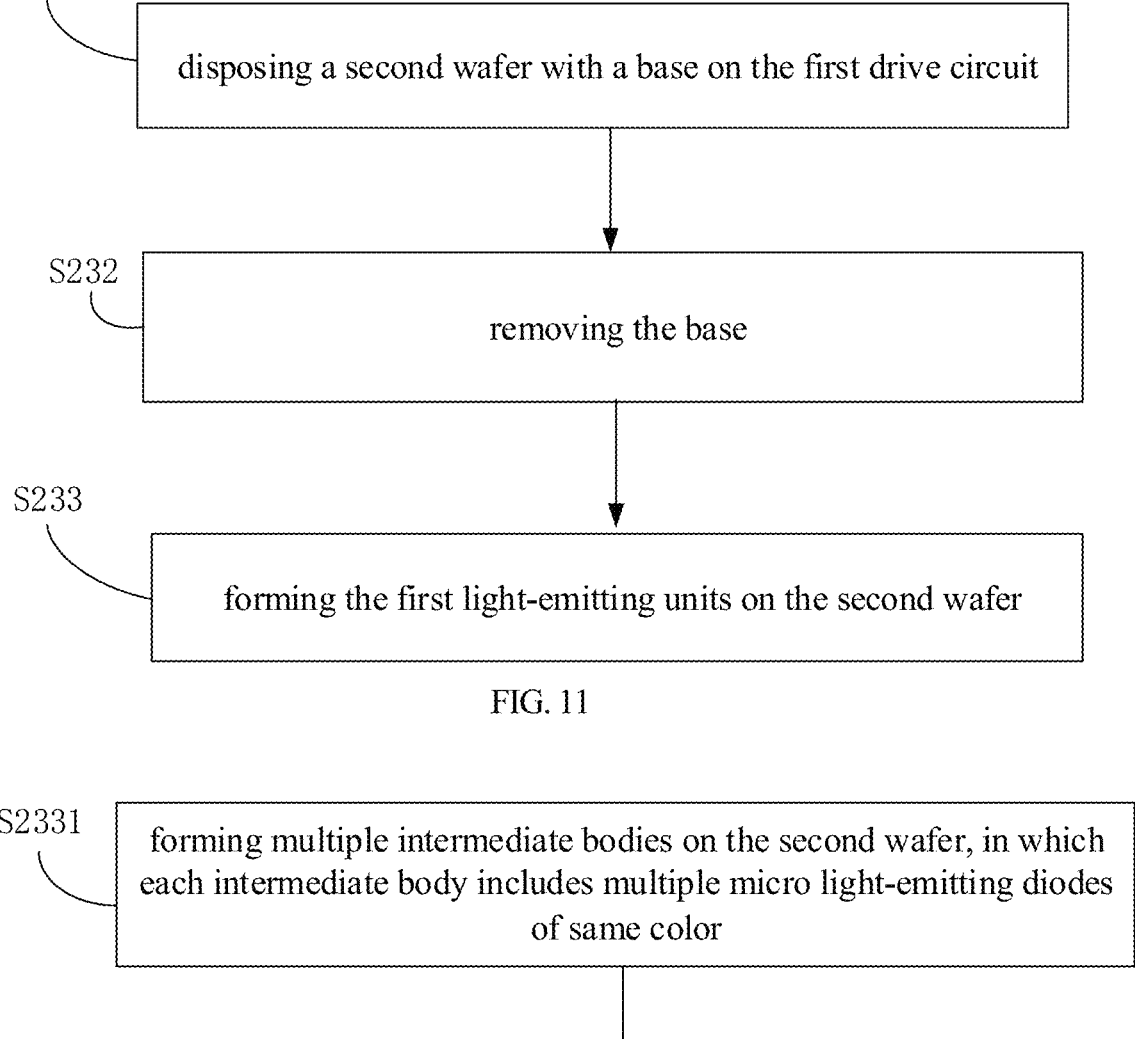

S231 disposing a second wafer with a base on the first drive circuit

S232 removing the base

S233 forming the first light-emitting units on the second wafer

FIG. 11

S2331 forming multiple intermediate bodies on the second wafer, in which each intermediate body includes multiple micro light-emitting diodes of same color

S2332 performing color conversion on the multiple micro light-emitting diodes of same color to obtain the first light-emitting unit, in which the first light-emitting unit includes a red micro light-emitting diode, a green micro light-emitting diode, and a blue micro light-emitting diode

FIG. 12

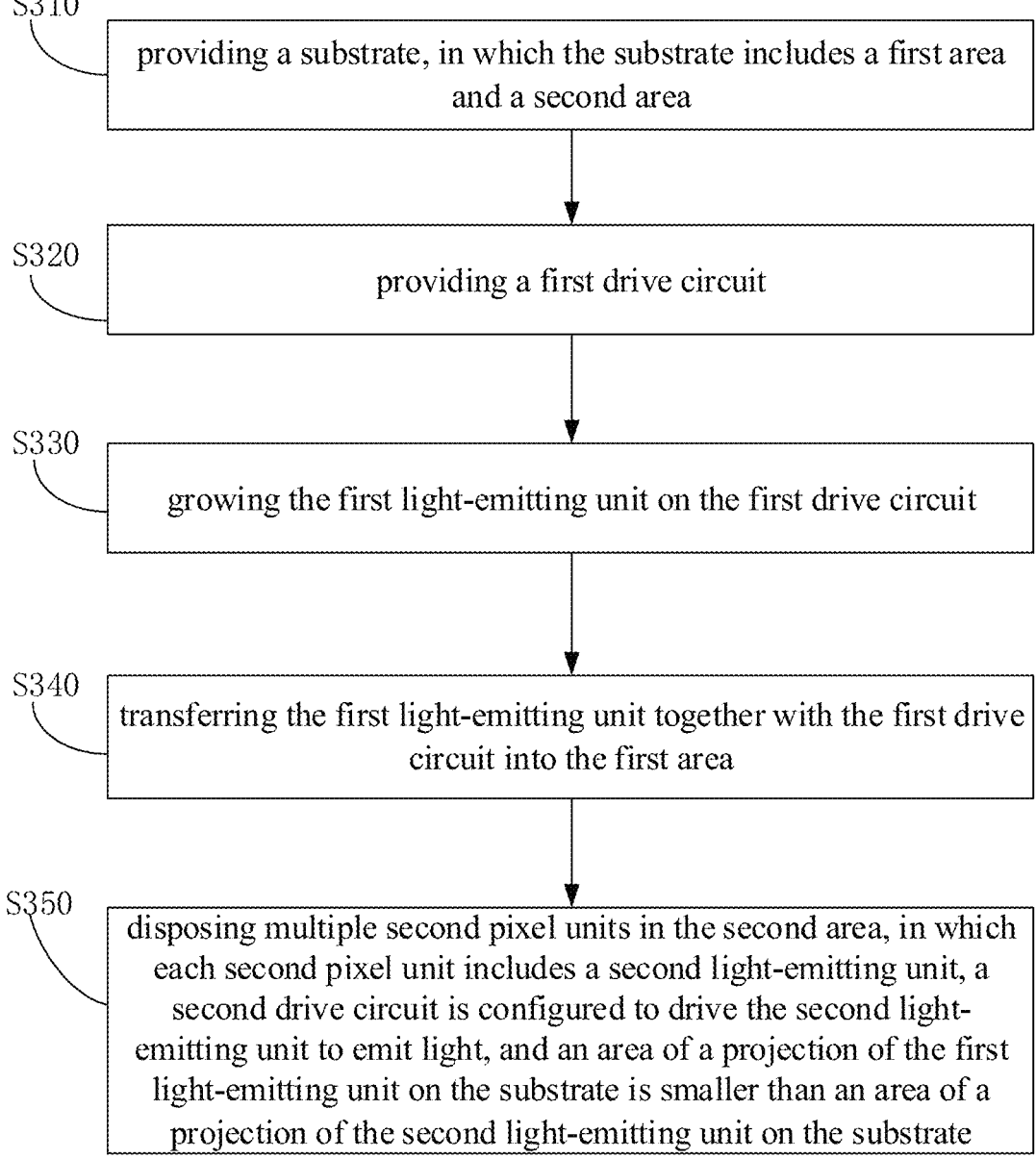

S310 providing a substrate, in which the substrate includes a first area and a second area

S320 providing a first drive circuit

S330 growing the first light-emitting unit on the first drive circuit

S340 transferring the first light-emitting unit together with the first drive circuit into the first area

S350 disposing multiple second pixel units in the second area, in which each second pixel unit includes a second light-emitting unit, a second drive circuit is configured to drive the second light-emitting unit to emit light, and an area of a projection of the first light-emitting unit on the substrate is smaller than an area of a projection of the second light-emitting unit on the substrate

FIG. 13

DISPLAY SCREEN, ELECTRONIC DEVICE AND MANUFACTURING METHOD

CROSS-REFERENCE TO RELATED APPLICATIONS

This application claims is a continuation of International Application No. PCT/CN2021/114257, filed Aug. 24, 2021, which claims priority to Chinese Patent Application No. 202011139129.2 filed on Oct. 22, 2020, the entire disclosures of which are incorporated herein by reference.

TECHNICAL FIELD

The disclosure relates to the field of mobile phone equipment, and particularly to a display screen, an electronic device, a method for manufacturing a display screen, and a method for manufacturing a pixel unit.

BACKGROUND

At present, full-screen mobile phones have become mainstream mobile phones. In the related art, a photosensitive element such as a fingerprint sensor or a camera may be disposed below a display screen to thereby enable the mobile phone to achieve a full-screen effect. In order to improve light transmittance of a part of the display screen corresponding to the photosensitive element, a method of reducing a pixel density of the part is generally used. However, an overall display effect of the display screen is affected consequently.

SUMMARY

Embodiments of the disclosure provide a display screen, an electronic device, and a method for manufacturing a display screen.

According to some embodiments of the disclosure, the display screen includes a substrate, multiple first pixel units and multiple second pixel units. The substrate includes a first area and a second area. Each of the multiple first pixel units includes a first light-emitting unit and a first driving circuit configured to drive the first light-emitting unit to emit light, the first light-emitting unit is disposed on the first driving circuit and arranged in the first area together with the first driving circuit. Each of the multiple second pixel units includes a second light-emitting unit, and the second light-emitting unit is arranged in the second area. The second driving circuit is configured to drive the second light-emitting unit to emit light, and the second light-emitting unit includes an organic light-emitting diode. An area of a projection of the first light-emitting unit on the substrate is smaller than an area of a projection of the second light-emitting unit on the substrate.

According to some embodiments of the disclosure, the electronic device includes the display screen including a first display area and a second display area. The first display area includes a first area of a substrate and multiple first pixel units, each first pixel unit includes a first light-emitting unit and a first driving circuit configured to drive the first light-emitting unit to emit light, the first light-emitting unit is disposed on the first driving circuit and arranged in the first area together with the first driving circuit. The second display area includes a second area of the substrate, multiple second pixel units and a second driving circuit, each second pixel unit includes a second light-emitting unit arranged in the second area, and the second driving circuit is configured to drive the second light-emitting unit to emit light. The electronic device further includes and a photosensitive element that is disposed below a first display area of the display screen.

The method for manufacturing a display screen includes operations as follows. A substrate including a first area and a second area is provided. Multiple first pixel units are provided, each of the multiple first pixel units includes a first light-emitting unit and a first driving circuit configured to drive the first light-emitting unit to emit light, and the first light-emitting unit is disposed on the first driving circuit. The first light-emitting unit together with the first driving circuit is transferred into the first area. Multiple second pixel units are disposed in the second area, each of the multiple second pixel units includes a second light-emitting unit, a second driving circuit is configured to drive the second light-emitting unit to emit light, and an area of a projection of the first light-emitting unit on the substrate is smaller than an area of a projection of the second light-emitting unit on the substrate. The multiple second pixel units are encapsulated the multiple second pixel units in an encapsulation layer.

BRIEF DESCRIPTION OF THE DRAWINGS

The above and/or additional aspects and advantages of the disclosure will become apparent and easily understood from the description of embodiments in conjunction with the accompanying drawings.

FIG. 8 illustrates a schematic flowchart of a method for manufacturing a display screen according to some embodiments of the disclosure;

FIG. 11 illustrates still another schematic flowchart of the method for manufacturing a display screen according to some embodiments of the disclosure;

FIG. 12 illustrates even still another schematic flowchart of the method for manufacturing a display screen according to some embodiments of the disclosure; and FIG. 13 illustrates a schematic flowchart of another method for manufacturing a display screen according to some embodiments of the disclosure.

DETAILED DESCRIPTION OF EMBODIMENTS

Figure 1:
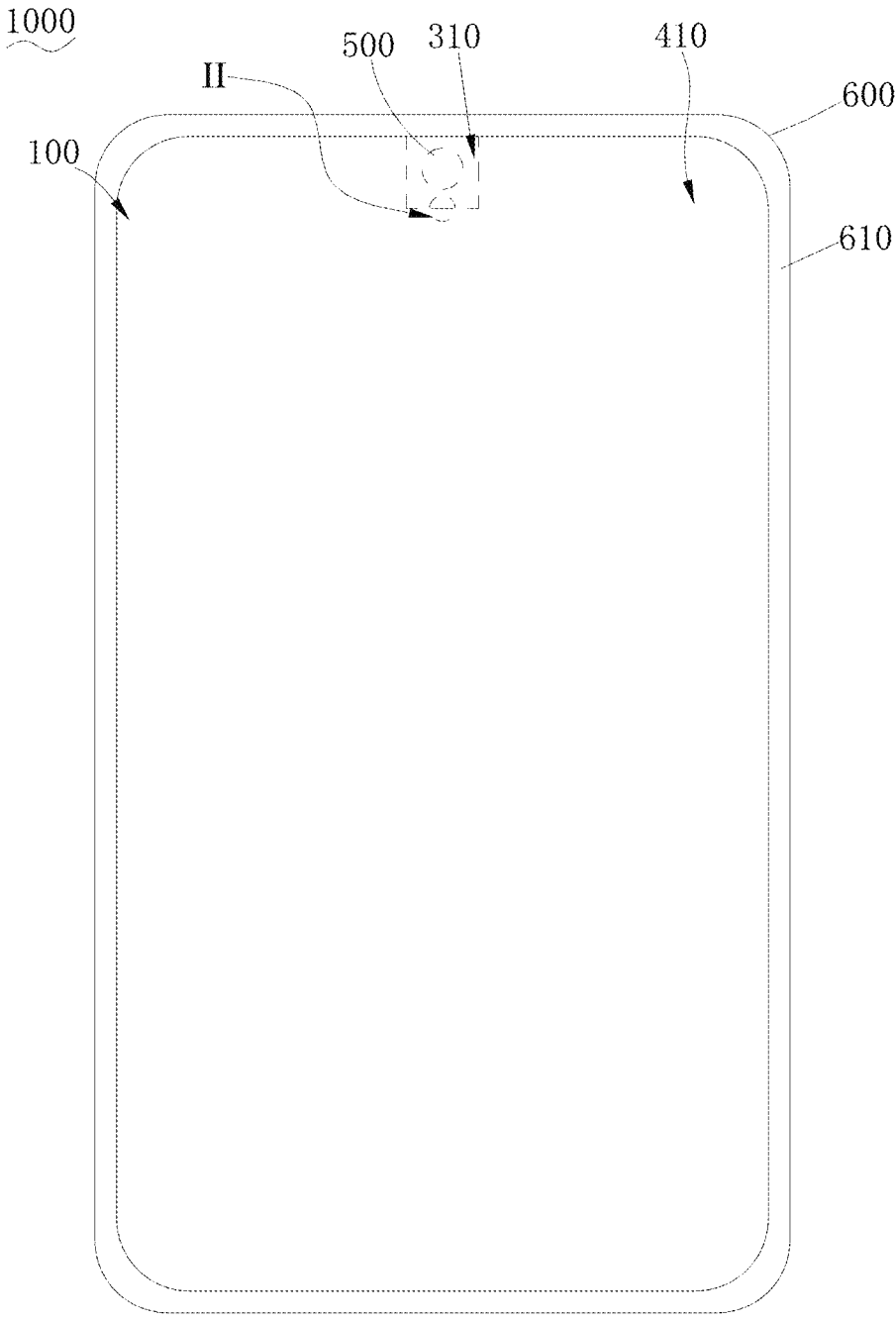
FIG. 1 illustrates a schematic structural diagram of an electronic device according to some embodiments of the disclosure.

Embodiments of the disclosure are described in detail below. Examples of the embodiments are shown in the accompanying drawings, in which the same or similar reference numerals indicate the same or similar elements or elements with the same or similar functions. The following embodiments described with reference to the accompanying drawings are exemplary, are only used to explain the disclosure, and cannot be understood as a limitation to the disclosure.

In the disclosure, unless specified or limited otherwise, a structure in which a first feature is "on" or "below" a second feature may include an embodiment in which the first feature is in direct contact with the second feature, and may also include an embodiment in which the first feature and the second feature are not in direct contact with each other, but are contacted via an additional feature formed therebetween. Furthermore, a first feature "on," "above," or "on top of" a second feature may include an embodiment in which the first feature is right or obliquely "on," "above," or "on top of" the second feature, or just mean the first feature is at a height higher than that of the second feature. While a first feature "below," "under," or "on bottom of" a second feature may include an embodiment in which the first feature is right or obliquely "below," "under," or "on bottom of" the second feature, or just means that the first feature is at a height lower than that of the second feature.

The following disclosure provides various embodiments or examples for implementing different structures of the disclosure. In order to simplify the disclosure of the disclosure, components and settings of specific examples are described below. Of course, these are only examples and are not intended to limit the disclosure. Moreover, the disclosure may repeat reference numerals and/or reference letters in different examples, and such repetition is for the purpose of simplification and clarity and does not indicate relationships between the various embodiments and/or settings in a discussion. In addition, the disclosure provides examples of a variety of specific processes and materials, but those skilled in the art can be aware of the use of other processes and/or the use of other materials.

As illustrated in FIGS. 1 to 4, some embodiments of the disclosure provide a display screen 100 including a substrate 200, multiple first pixel units 300 and multiple second pixel units 400. The substrate 200 includes a first area 210 and a second area 220. Each first pixel unit 300 includes a first light-emitting unit 330 and a first driving circuit 320, the first driving circuit 320 is configured to drive the first light-emitting unit 330 to emit light, and the first light-emitting unit 330 is provided on the first driving circuit 320 and is arranged in the first area 210 together with the first driving circuit 320.

Figure 2:
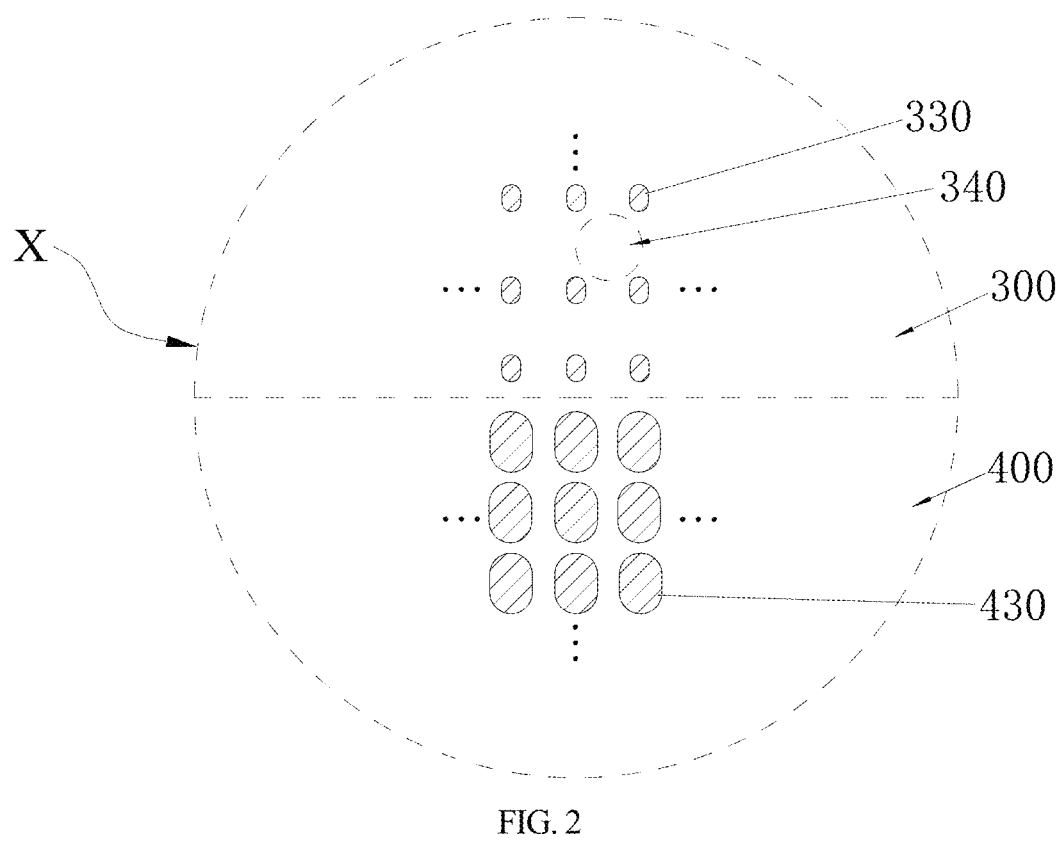
FIG. 2 illustrates a schematic enlarged structural diagram of a circled portion II of the electronic device illustrated in FIG. 1.

As illustrated in FIG. 2, in some embodiments, a pixel density of the first display area 310 is the same as a pixel density of the second display area 410.

Figure 3:
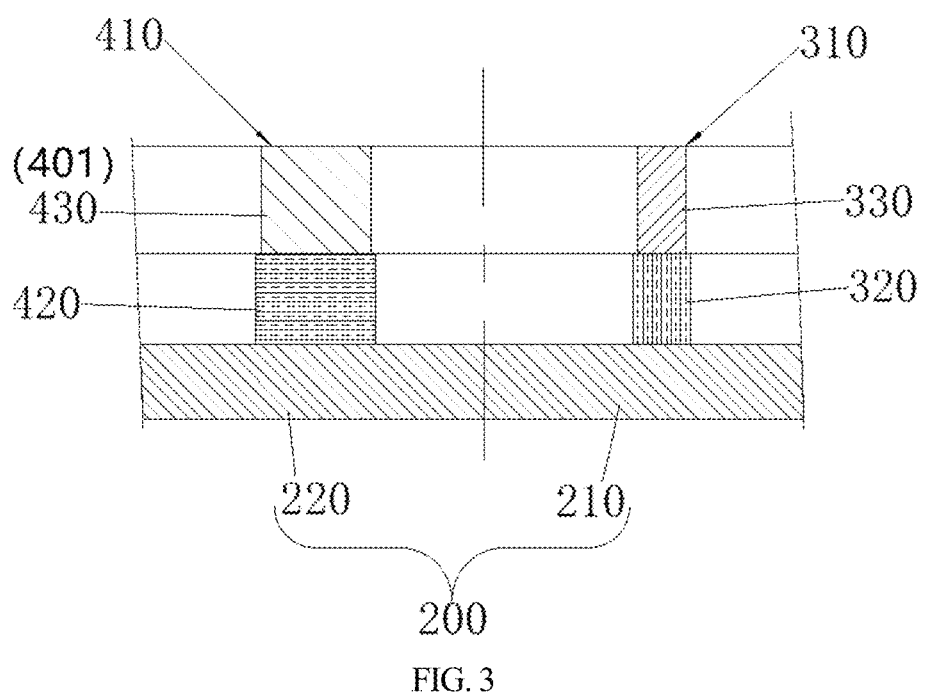
FIG. 3 illustrates a schematic diagram of a stacked structure of a display screen according to some embodiments of the disclosure.
Figure 4:
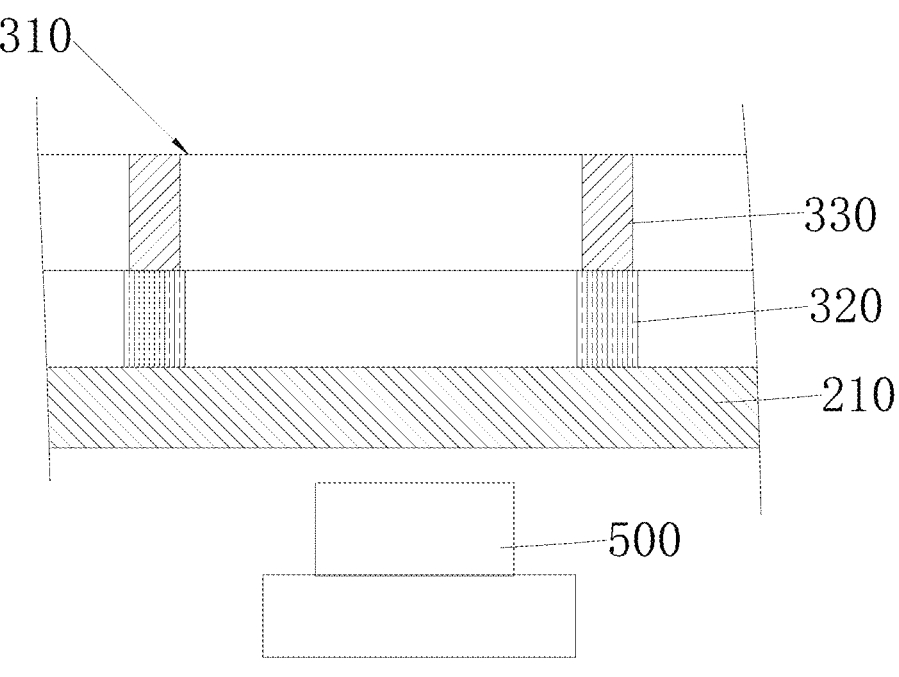
FIG. 4 illustrates a schematic diagram of a combination of the display screen and a photosensitive element according to some embodiment of the disclosure.

As illustrated in FIGS. 3 and 4, in some embodiments, a lifespan of the first light-emitting unit 330 is longer than a lifespan of the second light-emitting unit 401.

Figure 5:
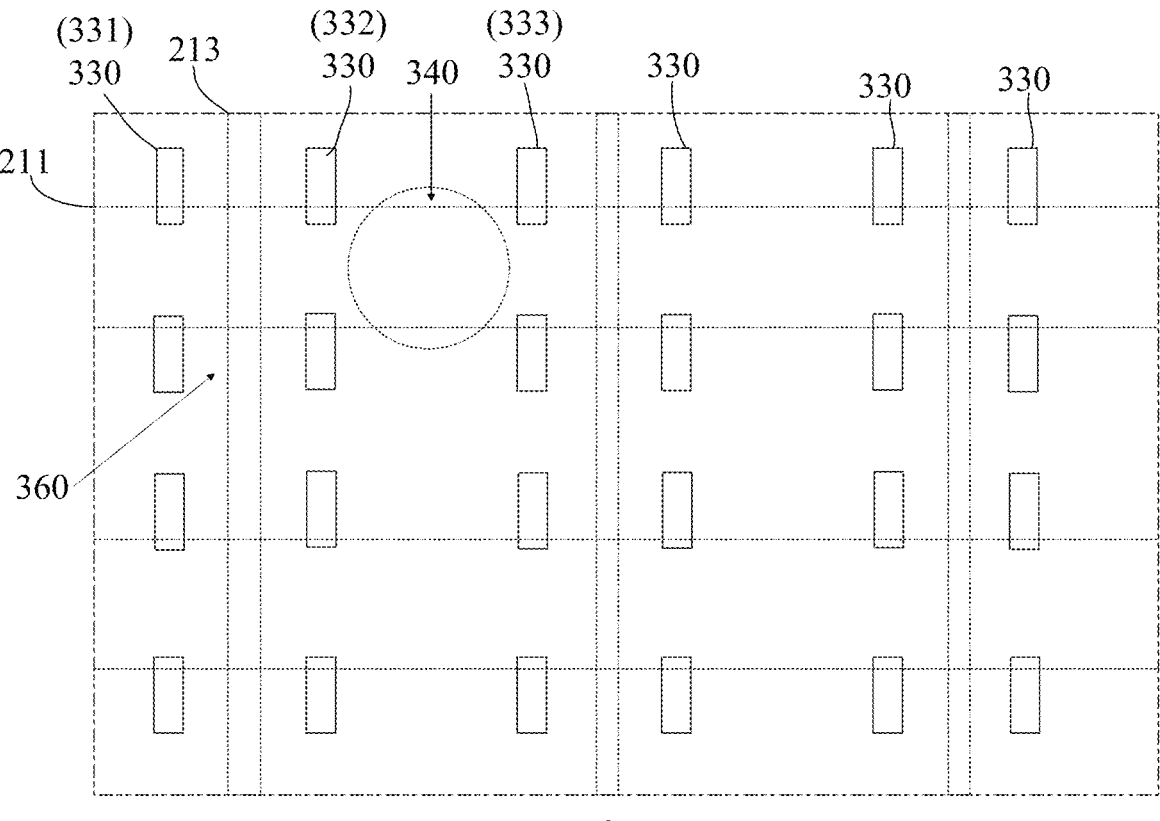
FIG. 5 illustrates a schematic diagram of an array of micro light-emitting diodes according to some embodiments of the disclosure.

As illustrated in FIG. 5, in some embodiments, the first light-emitting unit 330 includes micro light-emitting diodes of three colors respectively being a red micro light-emitting diode 331, a green micro light-emitting diode 332, and a blue micro light-emitting diode 333. In this way, the display screen 100 can generate various kinds of color light.

As illustrated in FIGS. 3 and 4, in some embodiments, the projection of the first light-emitting unit 330 on the substrate 200 covers a projection of the first driving circuit 320 on the substrate 200.

Figure 6:
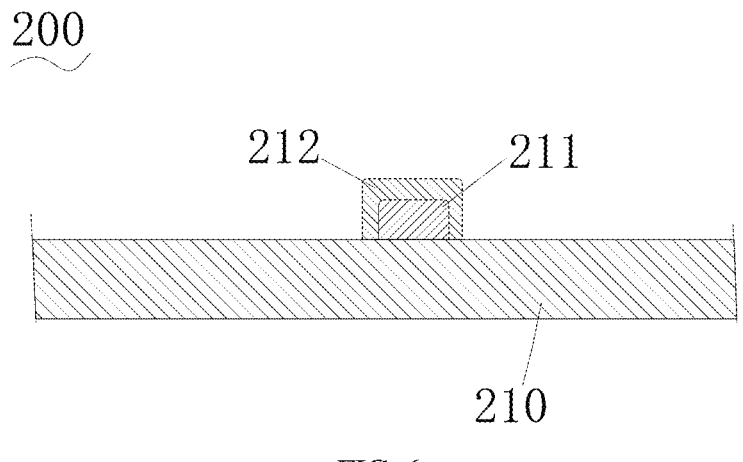
FIG. 6 illustrates a schematic cross-sectional diagram of an electrical connection line and a light absorption layer according to some embodiments of the disclosure.

As illustrated in FIGS. 5 and 6, in some embodiments, the display screen 100 includes an electrical connection line 211 disposed in the first area 210 and a light absorption layer 212, and the light absorption layer 212 is disposed covering the electrical connection line 211.

As illustrated in FIGS. 2 and 5, in some embodiments, the multiple first pixel units 300 are arranged in an array, a longitudinal spacing area 360 is defined between the first pixel units of adjacent columns. The display screen 100 further includes the electrical connection line 213 disposed in the first area 210 and extending along a column direction of the multiple first pixel units 300. The longitudinal electrical connection line 213 is connected with the first driving circuit 320 and is located in one of any two adjacent longitudinal spacing areas 360.

As illustrated in FIGS. 2, 5 and 6, in some embodiments, the multiple first pixel units 300 are arranged in an array, and a transverse spacing area 340 is formed between the first pixel units 300 of adjacent rows. The display screen 100 further includes a transverse electrical connection line 211 disposed in the first area 210 and extending along a row direction of the multiple first pixel units 300, the transverse electrical connection line 211 is connected with the first driving circuit 320. One of adjacent two the transverse spacing areas 340 is disposed with the transverse electrical connection line 211 therein, and the transverse electrical connection line 211 is located at an edge of the one of adjacent two the transverse spacing areas 340.

Figure 7:
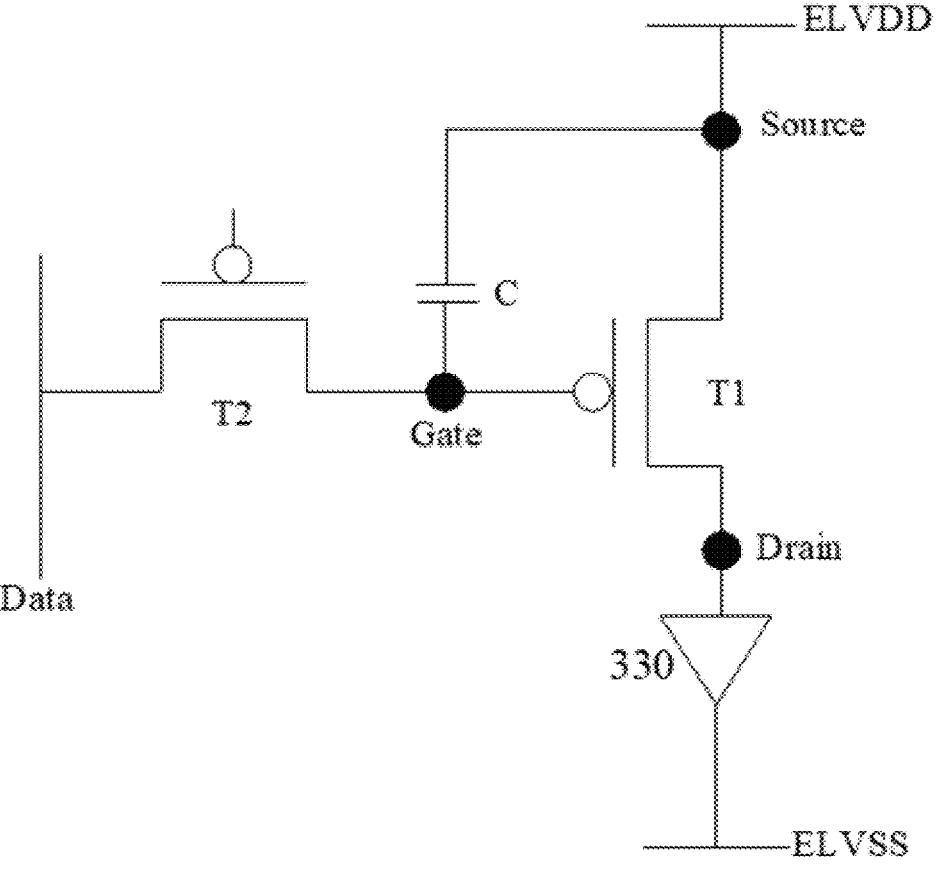
FIG. 7 illustrates a schematic partial circuit diagram of a first driving circuit according to some embodiments of the disclosure.

As illustrated in FIGS. 6 and 7, in some embodiments, the first driving circuit 320 includes a two transistors and one capacitor (2T1C) driving circuit.

As illustrated in FIGS. 1 and 4, an electronic device 1000 according to some embodiment of the disclosure includes the display screen 100 of any of the above-illustrated embodiments and a photosensitive element 500, and the photosensitive element 500 is disposed below the first display area 310.

Figures 9, 10:
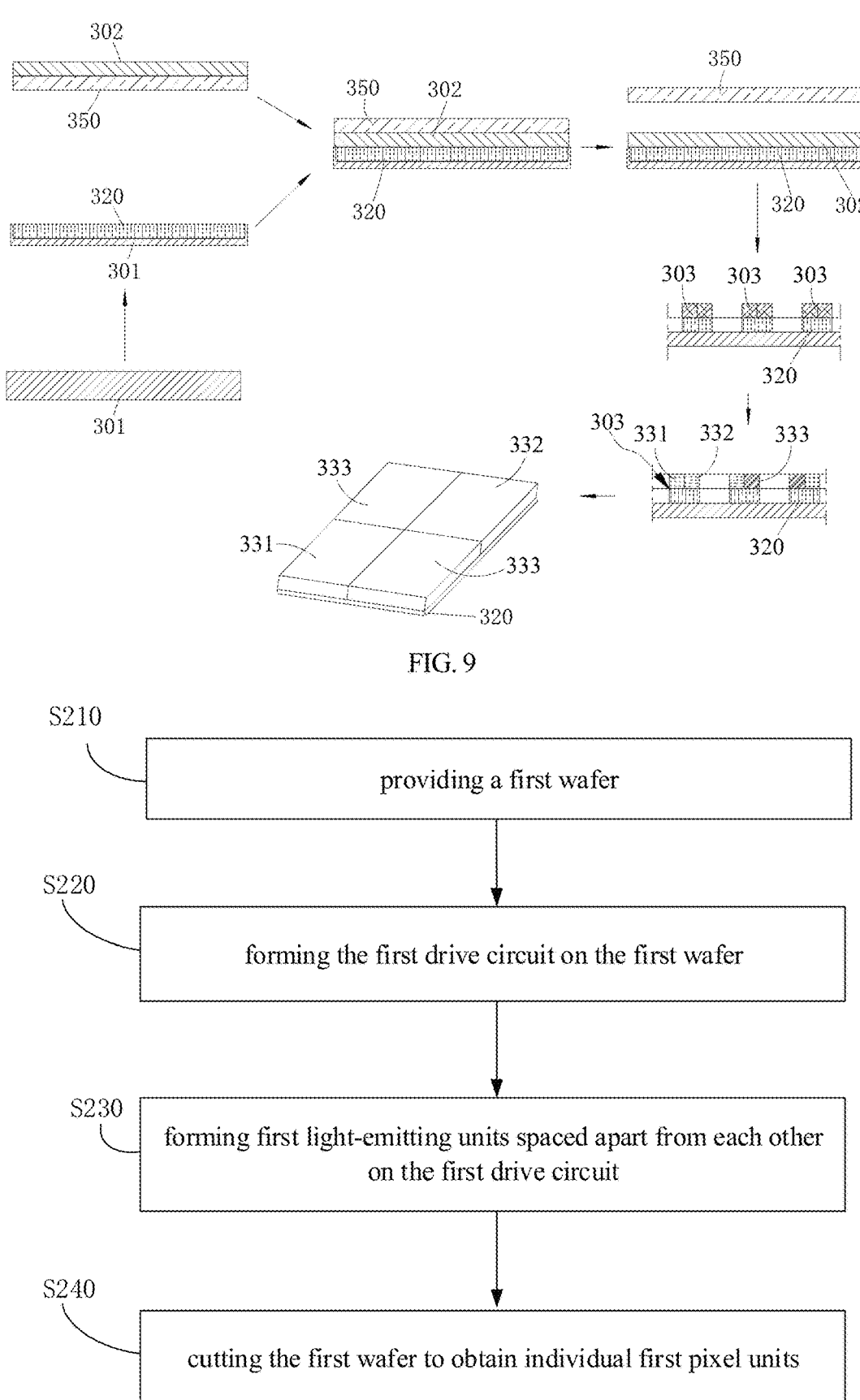
FIG. 9 illustrates a schematic process diagram of the method for manufacturing the display screen according to some embodiments of the disclosure.
FIG. 10 illustrates another schematic flowchart of the method for manufacturing a display screen according to some embodiments of the disclosure.

As illustrated in FIGS. 8 and 9, a method for manufacturing a display screen 100 according to some embodiments of the disclosure includes operations:

providing substrate 200, in which the substrate 200 includes a first area 210 and a second area 220;

providing multiple first pixel units, in which the first pixel unit 300 includes a first light-emitting unit 330 and a first driving circuit 320 configured to drive the first light-emitting unit 330 to emit light, and the first light-emitting unit is disposed on the first driving circuit;

transferring the first light-emitting unit 330 together with the first driving circuit 320 into the first area 210;

disposing multiple second pixel units 400 in the second area 220, in which each second pixel unit 400 includes a second light-emitting unit 401, a second driving circuit 420 is configured to drive the second light-emitting unit 401 to emit light, and an area of a projection of the first light-emitting unit 330 on the substrate 200 is smaller than an area of a projection of the second light-emitting unit 401 on the substrate 200; and encapsulating multiple second pixel units 400 in an encapsulation layer.

As illustrated in FIG. 9, the method for manufacturing the display screen 100 according to some embodiments of the disclosure further includes:

attaching a polarizer on the encapsulation layer.

As illustrated in FIGS. 9 and 10, in some embodiments, the first pixel unit 300 is provided through steps including:

providing a first wafer 301;

forming the first driving circuit 320 on the first wafer 301;

forming first light-emitting units 330 spaced apart from each other on the first driving circuit 320; and cutting the first wafer 301 to obtain individual first pixel units 300.

As illustrated in FIGS. 9 and 11, in some embodiments, the forming first light-emitting units 330 spaced apart from each other on the first driving circuit 320, includes:

disposing a second wafer 302 with a base 350 on the first driving circuit 320;

removing the base 350; and forming the first light-emitting units 330 on the second wafer 302.

As illustrated in FIGS. 9 and 12, in some embodiments, the forming the first light-emitting units 330 on the second wafer 302, includes:

forming multiple intermediate bodies 303 on the second wafer 302, in which each intermediate body 303 includes multiple micro light-emitting diodes of same color; and performing color conversion on the multiple micro light-emitting diodes of same color to obtain the first light-emitting unit 330, in which the first light-emitting unit 330 includes a red micro light-emitting diode 331, a green micro light-emitting diode 332 and a blue micro light-emitting diode 333.

As illustrated in FIGS. 9 and 13, a method for manufacturing the display screen 100 according to some embodiments of the disclosure includes:

providing a substrate 200, in which the substrate 200 includes a first area 210 and a second area 220;

providing a first driving circuit 320;

growing the first light-emitting unit 330 on the first driving circuit 320;

transferring the first light-emitting unit 330 together with the first driving circuit 320 into the first area 210; and disposing multiple second pixel units 400 in the second area 220, in which each second pixel unit 400 includes a second light-emitting unit 401, a second driving circuit 420 is configured to drive the second light-emitting unit 401 to emit light, and an area of a projection of the first light-emitting unit 330 on the substrate 200 is smaller than an area of a projection of the second light-emitting unit 401 on the substrate 200.

A method for capturing a panoramic image according to some embodiment of the disclosure will be described in detail below with reference to the accompanying drawings.

As illustrated in FIGS. 1 to 4, some embodiments of the disclosure provide a display screen 100 including a substrate 200, multiple first pixel units 300 and multiple second pixel units 400. The substrate 200 includes a first area 210 and a second area 220. Each first pixel unit 300 includes a first light-emitting unit 330 and a first driving circuit 320, the first driving circuit 320 is configured to drive the first light-emitting unit 330 to emit light, the first light-emitting unit 330 is provided on the first driving circuit 320 and is arranged in the first area 210 together with the first driving circuit 320.

Each second pixel unit 400 includes a second light-emitting unit 401, and the second light-emitting unit 401 is arranged in the second area 220. A second driving circuit 420 is configured to drive the second light-emitting unit 401 to emit light. An area of a projection (also referred to as a projection area) of the first light-emitting unit 330 on the substrate 200 is smaller than an area of a projection of the second light-emitting unit 401 on the substrate 200.

In the display screen 100 according to the illustrated embodiments of the disclosure, the first light-emitting unit 330 is provided on the first driving circuit 320 and is disposed in the first area 210 together with the first driving circuit 320, which can avoid overall laying a driving circuit in the first area 210 and prevent blocking the light by the overall laid driving circuit. In addition, a projection area of the first light-emitting unit 330 on the substrate 200 is smaller than a projection area of the second light-emitting unit 401 on the substrate 200, so that the first light-emitting unit 330 occupies a small area, which improves light transmittance of an area of the display screen 100 corresponding to the first area 210 on the basis of ensuring a display effect of the display screen 100.

In some embodiments, the first light-emitting unit 330 includes a micro light-emitting diode (abbreviated as LED), and the second light-emitting unit 401 includes an organic light-emitting diode (abbreviated as OLED) 430.

In some embodiments related to an OLED display, the display screen adopts a low pixels per inch (abbreviated as PPI) design for an under-screen camera area to improve transmittance and appropriately reduce diffraction. In order to ensure that luminance (brightness) of the under-screen camera area is consistent with that of a normal area, it is necessary to increase luminance of the individual pixels in a low PPI area, which makes the pixels in the low PPI area decline quickly, and after a long time decay, it can be seen that a gap between the pixel in the low PPI area and the pixel in a high PPI area is becoming more and more obvious. In addition, the under-screen camera area with the low PPI will also lead to incomplete pixels, resulting in problems such as internal aliasing, graininess or color edges. This in turn makes such area appear uneven in luminance and various traces.

In the embodiment of the disclosure, the display screen 100 may include the first display area 310 and the second display area 410, and the first display area 310 includes the first area 210 and the first pixel unit 300. The second display area 410 includes the second area 220, the second pixel unit 400 and the second driving circuit 420. In other words, the first display area 310 is arranged corresponding to the first area 210, and the second display area 410 is arranged corresponding to the second area 220.

The first light-emitting unit 330 in the first display area 310 uses a micro LED for displaying, and the second light-emitting unit 401 in the second display area 410 uses an OLED 430 display technology. The first display area 310 takes advantage of an ultra-long display lifespan of inorganic micro LED to overcome a risk of a short lifespan and screen burn caused by the high luminance of the pixels in the low PPI under-screen camera area. On the one hand, the micro LED has a small area, a low PPI pixel density and high light transmittance, which significantly increases an amount of light intake in the under-screen camera area and thus improves an imaging quality of the camera; on the other hand, high luminance of the individual pixels of the micro LED allows the first display area 310 and the second display area 410 to perform the displaying in cooperation, making the display screen 100 display complete content.

Specifically, light transmittance of the first display area 310 is greater than light transmittance of the second display area 410, the first display area 310 can be used for an optical sensor to transmit a signal, the first display area 310 displays images through the micro LEDs, the second display area 410 displays an image through the organic LEDs 430. Because luminous intensity of the micro LED is significantly greater than luminous intensity of the organic LED 430, the maximum luminance of the first display area 310 will not be significantly lower than the maximum luminance of the second display area 410, the maximum luminance of the first display area 310 and the second display area 410 is similar, and uniformity of the first display area 310 and the second display area 410 is desirable.

The first display area 310 and the second display area 410 in the illustrated embodiments of the disclosure may be connected closely adjacent to each other. Both the first display area 310 and the second display area 410 may be used to display a text or an image. For example, the first display area 310 and the second display area 410 may together display the same photo.

For example, the second display area 410 displays a part of a preset image, and the first display area 310 displays the remaining part of the preset image. The first display area 310 and the second display area 410 may also display different images. For another example, the second display area 410 displays a preset image, and the first display area 310 displays a taskbar image. Both the first display area 310 and the second display area 410 can display content, the display area is complete, and the display screen 100 has a high screen-to-body ratio.

In some embodiments, the second display area 410 may be arranged around the first display area 310, and a periphery of the first display area 310 may be adjacent to the second display area 410. In other words, the first display area 310 is located in the middle of the second display area 410.

In some embodiments, the second display area 410 may also partially surround the first display area 310 with a part of an edge of the first display area 310 abutting the second display area 410. For example, the first display area 310 is located at a corner location of the display 100 or in a middle area of a top of the display 100.

In the illustrated embodiments of the disclosure, a combination manner and specific positions of the first display area 310 and the second display area 410 are not limited, thereby meeting different requirements.

In order to improve a transmission of a light signal through the first display area 310, the light transmittance of the first display area 310 should be greater than the light transmittance of the second display area 410 as much as possible. However, in order to ensure luminance uniformity of the first display area 310 and the second display area 410, a difference between the maximum luminance of the first display area 310 and the second display area 410 cannot be too large.

It should be noted that the above-mentioned maximum luminance refers to the maximum luminance per unit area. Therefore, a distribution density of the micro LEDs may be set as required. For example, the distribution density of the micro LEDs in the first display area 310 is not greater than a distribution density of the OLEDs 430 in the second display area 410, and the maximum luminance per unit area of the first display area 310 may also be not less than the maximum luminance per unit area of the second display area 410.

In other words, the distribution density of the micro LEDs is equal to or less than the distribution density of the OLEDs 430, so as to improve the light transmittance of the first display area 310. But the distribution density of the micro LEDs is not very small, the maximum luminance per unit area of the first display area 310 may also be slightly greater than or equal to or slightly less than the maximum luminance per unit area of the second display area 410.

As illustrated in FIG. 3, FIG. 3 illustrates a schematic diagram of a stacked structure of the display screen 100 according to some embodiments of the disclosure. The first display area 310 further includes the first area 210 of the substrate 200, and the micro LED is disposed in the first area 210. The first display area 310 further includes the first driving circuit 320 for driving the micro LED, and the first driving circuit 320 is disposed between the first area 210 and the micro LED, the micro LED is disposed at least partially opposite to the first driving circuit 320. In this way, an amount of light transmitted by the first display area 310 is improved to the greatest extent. In addition, in actual production of the first light-emitting unit 330, the first driving circuit 320 and the micro LED are simultaneously produced by using a wafer production process, which improves a production yield.

The display screen 100 may be a full-screen, that is, the entire display area of the display screen 100 is substantially configured for displaying. The display screen 20 may further be provided thereon with a cover plate. The cover plate covers the display screen 100 to protect the display screen 100, so as to prevent the display screen 100 from being scratched or damaged. The cover plate may be a transparent glass cover plate, so that the user can see the information displayed on the display screen 20 through the cover plate. For example, the cover plate can be a glass cover plate made of sapphire crystal. In some embodiments of the disclosure, the display screen 100 may be in a regular shape, such as a rectangle, a rounded rectangle, or a circle. Obviously, in some other possible embodiments, the display screen 100 can also be in an irregular shape, which is not limited in the illustrated embodiments of the disclosure.

As illustrated in FIG. 2, in some embodiments, a pixel density of the first display area 310 is the same as a pixel density of the second display area 410.

In this way, the first display area 310 and the second display area 410 have similar display effects on the basis of ensuring a certain amount of light transmitted.

Specifically, the first display area 310 and the second display area 410 with the same pixel density have similar maximum luminance. Because the luminous intensity of the micro LED is much higher than that of the OLED 430, and the micro LED has a small size which is much smaller than a size of the OLED 430. Therefore, when the distribution density of the micro LEDs in the first display area 310 is equal to the distribution density of the OLEDs 430, a spacing area 340 (which may also be understood as a window) is large, that is, a proportion of a high light transmittance area without pixels in the first display area 310 is high, so that the light transmittance of the first display area 310 is also much greater than that of the second display area 410.

In addition, since the luminous intensity of the micro LED is much higher than that of the OLED 430, despite the size of the micro LED is small, it is possible that the maximum luminance of the first display area 310 is not less than the maximum luminance of the second display area 410, or the maximum luminance of the first display area 310 is only slightly less than the maximum luminance of the second display area 410.

In some embodiments, a pixel density of the first pixel unit 300 is less than a pixel density of the second pixel unit 400. In this way, the light transmittance of the first display area 310 is improved on the premise of ensuring stable brightness. Specifically, it requires improving the light transmittance of the first display area 310 as much as possible on the premise that the maximum luminance of the first display area 310 may not be less than the maximum luminance of the second display area 410, or the maximum luminance of the first display area 310 may be only slightly smaller than the maximum luminance of the second display area 410. Therefore, the distribution density of the micro LEDs may be set as required.

For example, the distribution density of the micro LEDs in the first display area 310 is less than the distribution density of the OLEDs 430 in the second display area 410, so as to improve the light transmittance of the first display area 310. When the distribution density of the micro LEDs is less than the distribution density of the OLEDs 430, the maximum luminance per unit area of the first display area 310 may also be slightly greater than or equal to or slightly less than the maximum luminance per unit area of the second display area 410.

As illustrated in FIGS. 3 and 4, in some embodiments, a lifespan of the first light-emitting unit 330 is longer than a lifespan of the second light-emitting unit 401.

As such, the first light-emitting unit 330 maintains a long life expectancy even under a high intensity operating condition, ensuring that the first display area 310 and the second display area 410 have a similar life expectancy.

Specifically, the micro LED has advantages of ultra-high display life and low energy consumption due to inorganic material, and thus the distribution density of the micro LEDs can be set as required. For example, the distribution density of the micro LEDs in the first display area 310 may not be greater than a distribution density of the OLEDs 430 in the second display area 410, and the maximum luminance per unit area of the first display area 310 may also be not less than the maximum luminance per unit area of the second display area 410. In this way, the first display area may be taken as a display area for the under-screen camera. As such, the under-screen camera is enabled with a sufficient amount of light transmitted under the first display area 310, and ensures that display luminance of the first display area 310 and the second display area 410 is similar.

As illustrated in FIG. 5, in some embodiments, the first light-emitting unit 330 includes micro LEDs of three colors respectively being a red micro LED 331, a green micro LED 332, and a blue micro LED 333. In this way, the display screen 100 can generate various kinds of color light.

Specifically, a combination of the red micro LED 331, the green micro LED 332, and the blue micro LED 333 forms an R/G/B Micro LED additive color model. It can be understood that, in optics, red, green and blue are the three primary colors of optics, and various kinds of color light can be generated as long as the color light of red, green and blue are controlled to be added in different proportions.

The first driving circuit 320 is configured to control luminous intensity of the red micro LED 331, a green micro LED 332, and a blue micro LED 333 respectively. For example, the first driving circuit 320 controls the red micro-LED 331 to have weak luminous intensity, and controls the green micro-LED 332 to have strong luminous intensity, thereby emitting yellow light. For example, the first driving circuit 320 controls the red micro-LED 331 to have strong luminous intensity, and controls the green micro-LED 332 to have weak luminous intensity, thereby emitting orange light. The first driving circuit 320 can control the micro LEDs to switch between red, yellow, orange and green.

As illustrated in FIGS. 3 and 4, in some embodiments, a projection of the first light-emitting unit 330 on the substrate 200 covers a projection of the first driving circuit 320 on the substrate 200. In this way, the light transmittance of the first display area 310 is improved.

Specifically, the substrate 200 includes the first driving circuit 320 and the first light-emitting unit 330. Because the first driving circuit 320 includes an opaque part, the light transmittance of the first light-emitting unit 330 is not high. Thus, the first driving circuit 320 and the first light-emitting unit 330, both of which have low light transmittance, are set at least partially opposite each other, and the opaque parts are arranged overlapped to expose parts with high light transmittance, thereby improving the overall light transmittance of the first display area 310.

The first light-emitting unit 330 has a first orthographic projection on the first region 210, the first driving circuit 320 has a second orthographic projection on the first region 210, and one of the first orthographic projection and the second orthographic projection is located within the other, which can also be understood as the first light-emitting unit 330 and the first driving circuit 320 being arranged overlapped.

When a size of the first light-emitting unit 330 is greater than a size of the first driving circuit 320, the second orthographic projection is within the first orthographic projection. In other words, the first light-emitting unit 330 covers the first driving circuit 320. When the size of the first light-emitting unit 330 is less than the size of the first driving circuit 320, the first orthographic projection is located within the second orthographic projection.

Exemplarily, because of the small size of the micro LED, the window of the first display area may account for 97% of the total area and the light-emitting area only accounts for 3% of the total area, which greatly enhances the light transmittance. At the same time, the first display area 310 can achieve a transmittance of 75%.

The OLED 430 has a light-emitting area accounting for 30% and a transmittance of 45%, which is far less than that of a micro LED. In the illustrated embodiments of the disclosure, the area of the first display area 310 is small (for example, 5 mm*5 mm area), and it requires a low light emission, and thus a 2T1C driving circuit without a compensation function may be used, which can improve the transmittance of a backplane to a greater extent compared to a 7T1C (seven transistors, one capacitor) driving circuit with the compensation function.

In some embodiments, the first driving circuit 320 includes a complementary metal oxide semiconductor (abbreviated as CMOS) driving circuit. In this way, the area of the first driving circuit 320 is further reduced, and the light transmittance is improved.

In the illustrated embodiments of the disclosure, it used a combined structure of Micro LED+CMOS driving circuit, in which the CMOS driving circuit refers to a technology used for chip manufacturing. When growing the micro LED, the first driving circuit 320 and the Micro LED are made simultaneously using a wafer production process. In this way, a substrate drive layer of the Micro LED display 100 does not require an additional pixel driving circuit, i.e., only necessary signal lines need to be made on the substrate layer.

The adopted combined structure of the Micro LED+CMOS driving circuit not only improves the production yield, but also maximizes the transmittance of the first display area 310. In addition, the adopted combined structure of the Micro LED+CMOS driving circuit has a small volume and low reflectivity to further reduce the reflectivity in this area.

As illustrated in FIGS. 5 and 6, in some embodiments, the display screen 100 includes an electrical connection line 211 disposed in the first area 210 and a light absorption layer 212, and the light absorption layer 212 is arranged to cover the electrical connection line 211. As such, a generation of unwanted light is reduced, thereby improving the quality of the light signal.

Specifically, in the adopted combined structure of Micro LED+CMOS driving circuit, only necessary input (abbreviated as in) and output (abbreviated as out) electrical connection lines 211 of the first driving circuit 320 are made, so that the electrical connection lines 211 is greatly simplified, in which the electrical connection lines 211 may be metal wires. The electrical connection lines 211 are covered with a light absorption layer 212. The light absorption layer 212 is disposed at least partially opposite to the first driving circuit 320 and configured to block a light signal from arriving at the first driving circuit 320.

Because the first driving circuit 320 includes an opaque part, a signal of external light is reflected or refracted when arriving at the first driving circuit 320 to generate unwanted light, which affects the imaging quality of the image. The light absorption layer 212 may be made of black light-absorbing material, so as to prevent the light signal from arriving at the first driving circuit 320 and absorb the arrived light signal, thereby reducing a generation of the unwanted light. Furthermore, the light transmittance is increased. In an example, the light transmittance is about 50%, which also allows the first display area 310 not to be provided with a polarizer.

As illustrated in FIGS. 2 and 5, in some embodiments, the multiple first pixel units 300 are arranged in an array, a longitudinal spacing area 360 is defined between the first pixel units of adjacent columns. The display screen 100 further includes an electrical connection line 213 disposed in the first area 210 and extending along a column direction of the multiple first pixel units 300. The longitudinal electrical connection line 213 is connected with the first driving circuit 320 and is located in one of any two adjacent longitudinal spacing areas 360.

As such, the array arrangement of the multiple first pixel units 300 can control the first pixel units 300 well, so that the first display area 310 can generate various kinds of color light.

Specifically, the red micro LEDs 331, the green micro LEDs 332 and the blue micro LEDs 333 are arranged in respective column directions, and the three columns of the micro LEDs are arranged vertically in parallel. Each column of the micro LEDs has an electrical connection line 211 electrically connected thereto. In the illustrated embodiments of the disclosure, the electrical connection lines 211 are processed by edge wiring, that is, two column-oriented (i.e., longitudinal) electrical connection lines 211 are arranged in parallel, and the micro LEDs are respectively arranged on both sides of the two electrical connection lines 211, making the pixel design concentrated, while one of the two adjacent spacing areas 340 between the adjacent micro LEDs has a larger light transmittance than the other one. As illustrated in FIG. 5, since no column-oriented electrical connection line 211 is provided between the green micro LEDs 332 and the blue micro LEDs 333, the spacing area 340 between the green micro LEDs 332 and the blue micro LEDs 333 is greater than the spacing area 340 between the red micro LEDs 331 and the green micro LEDs 332. It should be noted that the order of the three colors in FIG. 5 is illustrated rather than restrictive. As such, an impact of diffraction caused by the electrical connection line 211 of the first display area 310 on the image quality of the photosensitive element 500 is minimized.

Exemplarily, the multiple first pixel units 300 are arranged in an array, with the red micro LED 331, the two longitudinal electrical connection lines 213, the green micro LED 333, the spacing area 340, the blue micro LED 333, and the two longitudinal electrical connection lines 213 forming a cycle along a row direction of the first pixel units 300. Such arrangement makes the spacing area 340 as large as possible, avoiding a problem that the spacing area 340 is too small due to an even arrangement of the row of the micro LEDs and the row of the electrical connection lines 211. The two electrical connection lines 213 are arranged close to each other, and the micro LEDs on both sides of the two electrical connection lines 213 are arranged close to the two electrical connection lines 213, thereby ensuring a large light-transmitting space in the spacing area 360.

As illustrated in FIG. 5, the multiple first light-emitting unit 330 includes first through third columns of micro LEDs respectively being a column of red micro LEDs 331, a column of green micro LEDs 332 and a column of blue micro LEDs 333 arranged in respective column directions, the first through third columns of micro LEDs are arranged vertically in parallel, and each column of micro LEDs in the first through third columns of micro LEDs have the longitudinal electrical connection line 213 electrically connected thereto. The adjacent two longitudinal spacing areas 360 are defined among the first through third columns of micro LEDs, a first one of the adjacent two longitudinal spacing areas 360 is disposed with two the longitudinal electrical connection lines 213 in parallel, a second one of the adjacent two longitudinal spacing areas 360 is disposed no longitudinal electrical connection line 213, and thereby the second one of the adjacent two longitudinal spacing areas 360 has a larger light transmittance than the first one of the adjacent two longitudinal spacing areas 360.

As illustrated in FIGS. 2, 5 and 6, in some embodiments, the multiple first pixel units 300 are arranged in an array, and a transverse spacing area 340 is formed between the first pixel units 300 of adjacent rows. The display screen 100 further includes a transverse electrical connection line 211 disposed in the first area 210 and extending along a row direction of the multiple first pixel units 300, the transverse electrical connection line 211 is connected with the first driving circuit 320 and disposed in one of any two adjacent transverse spacing areas 340, and the transverse electrical connection line 211 is located at an edge of the one of any two adjacent transverse spacing areas 340.

In this way, the first pixel unit 300 may be controlled, so as to enable the first display area 310 to generate a variety of color light and further improve the light transmission rate thereof.

Exemplarily, the micro LEDs are arranged at equal intervals in the column direction, and the spacing area 340 may exist in the interval. Each row of the micro LEDs has a transverse electrical connection line 211 electrically connected thereto. Two of the transverse electrical connection lines 211 may be set as one group, and one group of transverse electrical connection lines 211 are arranged close to each other and respectively located at edges of the micro LEDs, that is, the upper transverse electrical connection line 211 is arranged at a lower edge of the micro LED, and the lower transverse electrical connection line 211 is arranged at an upper edge of the micro LED. In this way, the spacing area 340 between the transverse electrical connection lines 211 of different groups is larger, and the spacing area 340 between the transverse electrical connection lines 211 of the same group is smaller. Thus, a transparent area is concentrated and maximized.

As illustrated in FIGS. 6 and 7, in some embodiments, the first driving circuit 320 includes a 2T1C driving circuit.

In this way, the use of the 2T1C driving circuit can maximize the light transmittance.

Specifically, the first area 210 needs to have larger light transmittance compared with the second area 220. The second area 220 uses the OLED, and therefore the second driving circuit 420 includes a 7T1C pixel driving circuit, which is a common driving circuit for the OLED. The first area 210 uses the micro LED, which can improve the light transmittance and compensate for the luminance uniformity.

Exemplarily, the 2T1C driving circuit refers to that a circuit mainly includes two thin film transistors (abbreviated as TFT) and one capacitor C. One of the thin film transistors T2 is a switch TFT, which may be controlled by a scanning signal Gate for controlling an entry of a data signal Data, and is a charging switch for controlling the capacitor C. The other thin film transistor T1 is a drive TFT for driving the micro LED and controlling a current passing through the micro LED. The capacitor C is mainly used to store the data signal Data, thereby controlling the driving current applied by T1 to the micro LED. The scan signal Gate may come from a gate drive and correspond to a certain row of scan lines. The data signal Data may come from a source drive and correspond to a certain column of data lines.

As illustrated in FIGS. 1 and 4, an electronic device 1000 according to some embodiment of the disclosure includes the display screen 100 of any of the above-illustrated embodiments and a photosensitive element 500, and the photosensitive element 500 is disposed below the first display area 310.

In the display screen 100 according to the illustrated embodiments of the disclosure, the first display area 310 adopts the micro LEDs, and adopts the independent first driving circuit 320 to drive the micro LEDs. During a manufacturing process, the first driving circuit 320 and the micro LEDs are made at the same time by the wafer production process, which can avoid laying the driving circuit on the whole first area 210. On the one hand, the production yield of the micro LEDs is improved, and on the other hand, the light transmittance of the first display area 310 is improved, and the luminance of the micro LEDs is high, so that the display effects of the first display area 310 and the second display area 410 are basically the same, which enables the display 100 with desirable display uniformity.

The photosensitive element 500 in the illustrated embodiments of the disclosure may be an optical sensor (i.e., a camera), and the optical sensor transmits a light signal through display screen 100. The display screen 100 of the illustrated embodiments of the disclosure is divided into different areas in such a manner that the light transmittance of the first display area 310 is made greater than the light transmittance of the second display area 410, so that the effect of transmitting the light signal is improved.

Specifically, one or more cameras may be provided below the first display area 310. The multiple cameras can work cooperatively. For example, the multiple cameras are two identical cameras, a normal camera and a camera with a shallow depth of field or a monochrome camera. In addition to the camera, other functional devices, such as a proximity sensor, a light sensor, a distance sensor, and a fingerprint recognition sensor, may be further provided below the first display area 310.

The electronic device 1000 according to the embodiments of the disclosure may be a mobile terminal device such as a mobile phone and a tablet, and may also be a device including a display apparatus, such as a gaming device, an augmented reality (AR) device, a virtual reality (VR) device, a vehicle on-board computer, a laptop, a data storage device, an audio display apparatus, a video display apparatus, and a wearable device, in which the wearable device may be a smart bracelet, smart glasses or the like. In the illustrated embodiments of the disclosure, a specific type of the electronic device 1000 is not limited, as long as including the display screen 100 and the photosensitive element 500 of the illustrated embodiments of the disclosure to meet different requirements.

In order to more comprehensively understand the electronic device 1000 provided by the illustrated embodiments of the disclosure, the structure of the electronic device 1000 will be further described below. As illustrated in FIG. 1, the electronic device 1000 further includes a housing 600. The housing 600 may include a rear cover (not shown) and a frame 610 which surrounds a periphery of the rear cover. The display screen 100 is disposed in the frame 610. The display screen 20 and the rear cover may serve as two opposite sides of the electronic device 1000. The camera is disposed between the rear cover of the housing 600 and the display screen 100.

The electronic device 1000 may further include a circuit board, a battery and a middle plate. The frame 610 is disposed around the middle plate, in which the frame 610 and the middle plate may form a middle frame of the electronic device 1000. Accommodating spaces are defined on both sides of the middle plate by the middle frame and the frame 610. One of the accommodating spaces is configured to accommodate the display screen 100, and the other accommodating space is configured to accommodate the circuit board, the battery, and other electronic components or functional assemblies of the electronic device 1000.

The middle plate can be in a thin plate-like or sheet-like structure, or can be a hollow frame structure. The middle frame is configured to provide support for the electronic components or functional components in the electronic device 1000, so that the electronic components and the functional components in the electronic device 1000 can be mounted together. The functional components such as the camera, a receiver, the circuit board, and the battery of the electronic device 1000 can be mounted on the middle frame or the circuit board for fixing. It can be understood that material of the middle frame can include metal or plastic, etc.

The circuit board can be mounted on the middle frame. The circuit board may be a main board of the electronic device 1000. One or more functional components such as a microphone, a speaker, a receiver, a headphone interface, an acceleration sensor, a gyroscope, and a processor can be integrated on the circuit board. Meanwhile, the display screen 100 can be electrically connected to the circuit board to control the display of the display screen 100 by the processor on the circuit board. Both the display screen 100 and the camera can be electrically connected to the processor. In response to receiving a shooting command, the processor controls the first display area 310 to be turned off and controls the camera to capture an image through the first display area 310. In response to not receiving the shooting command and receiving a command to display an image, the processor controls the second display area 410 and the first display area 310 to cooperatively display the image.

The battery can be mounted on the middle frame. Meanwhile, the battery is electrically connected to the circuit board, such that the battery supplies power to the electronic device 1000. The circuit board may be provided with a power management circuit. The power management circuit is configured to distribute voltage provided by the battery to various electronic components in the electronic device 1000.

As illustrated in FIGS. 8 and 9, a method for manufacturing a display screen 100 according to some embodiments of the disclosure includes operations as follows.

At S110, providing a substrate 200, in which the substrate 200 includes a first area 210 and a second area 220.

At S120, providing multiple first pixel units, in which each the first pixel unit 300 includes a first light-emitting unit 330 and a first driving circuit 320 configured to drive the first light-emitting unit 330 to emit light, and the first light-emitting unit is disposed on the first driving circuit.

At S130, transferring the first light-emitting unit 330 together with the first driving circuit 320 into the first area 210.

At S140, disposing multiple second pixel units 400 in the second area 220, in which each second pixel unit 400 includes a second light-emitting unit 401, a second driving circuit 420 is configured to drive the second light-emitting unit 401 to emit light, and an area of a projection of the first light-emitting unit 330 on the substrate 200 is smaller than an area of a projection of the second light-emitting unit 401 on the substrate 200.

At S150, encapsulating the multiple second pixel units 400 in an encapsulation layer.

In the display screen 100 according to the illustrated embodiments of the disclosure, the first display area 310 adopts the micro LEDs, and the independent first driving circuit 320 is used to drive the micro LEDs. During a manufacturing process, the first driving circuit 320 and the micro LEDs may be made at the same time by the wafer production process, which can avoid laying the driving circuit on the whole first area 210. On the one hand, the production yield of the micro LEDs is improved, and on the other hand, the light transmittance of the first display area 310 is improved, and the luminance of the micro LEDs is high, so that the display effects of the first display area 310 and the second display area 410 are basically the same, which enables the display 100 with desirable display uniformity.

Specifically, the substrate 200 may be provided to serve as a support structure for the pixel unit, and the driving circuit and the LEDs are first manufactured on the substrate. The substrate 200 is divided into two parts, the first area 210 carries the first pixel unit 300, and the second area 220 carries the second pixel unit 400. In addition, the second pixel unit 400 needs to be packaged by evaporation, and it requires to dispose the first driving circuit 320 directly under the micro LED in the first pixel unit 300. Finally, the first pixel unit 300 and the second pixel unit 400 are combined, and a polarizer, a touch layer and a glass cover are added to form a complete display screen 100.

It should be noted that the disclosure does not limit an order of executing S130 and S140, it is possible that S130 is executed first, and S140 is executed later, or S140 is executed first, and S130 is executed later.

As illustrated in FIG. 9, the method for manufacturing the display screen 100 according to some embodiments of the disclosure further includes:

attaching a polarizer on the encapsulation layer.

In this way, the polarizer can be provided to dissipate surface reflections and scatter the light to increase a viewing angle of the display screen 10.

As illustrated in FIGS. 9 and 10, in some embodiments, the first pixel unit 300 is manufactured by S210 to S240.

At S210, providing a first wafer 301.

At S220, forming the first driving circuit 320 on the first wafer 301.

At S230, forming multiple first light-emitting units 330 spaced apart from each other on the first driving circuit 320.

At S240, cutting the first wafer 301 to obtain individual first pixel units 300.

Specifically, the wafer is disposed on the base 350, and the first driving circuit 320 and the blue micro LED 333 are fabricated on the wafer to thereby epitaxially grow the blue micro LED 333. When the growth of the blue micro LED 333 is completed, the base 350 is removed, and then color conversion is performed for R/G/B color, and the cutting is finally performed to form a combination of the three primary colors of the red micro LED 331, the green micro LED 332 and the blue micro LED 333.

As illustrated in FIGS. 9 and 11, in some embodiments, the forming multiple first light-emitting units 330 spaced apart from each other on the first driving circuit 320 (S230), includes S231 to S233.

At S231, disposing a second wafer 302 with a base 350 on the first driving circuit 320.

At S232, removing the base 350.

At S233, forming first light-emitting units 330 on the second wafer 302.

As illustrated in FIGS. 9 and 12, in some embodiments, the forming first light-emitting units 330 on the second wafer 302 (S233) includes S2331 and S2332.

At S2331, forming multiple intermediate bodies 303 on the second wafer 302, in which each intermediate body 303 includes multiple micro light-emitting diodes of same color.

At S2332, performing color conversion on the multiple micro light-emitting diodes of same color to obtain the first light-emitting unit 330, in which the first light-emitting unit 330 includes a red micro light-emitting diode 331, a green micro light-emitting diode 332, and a blue micro light-emitting diode 333.

As illustrated in FIGS. 9 and 13, a method for manufacturing the display screen 100 according to some embodiments of the disclosure includes S310 to S350.

At S310, providing a substrate 200, in which the substrate 200 includes a first area 210 and a second area 220.

At S320, providing a first driving circuit 320.

At S330, growing a first light-emitting unit 330 on the first driving circuit 320.

At S340, transferring the first light-emitting unit 330 together with the first driving circuit 320 into the first area 210.

At S350, disposing multiple second pixel units 400 in the second area 220, in which each second pixel unit 400 includes a second light-emitting unit 401, a second driving circuit 420 is configured to drive the second light-emitting unit 401 to emit light, and an area of projection of the first light-emitting unit 330 on the substrate 200 is smaller than an area of projection of the second light-emitting unit 401 on the substrate 200.

In the description of the illustrated embodiments of the disclosure, terms, such as "first" and "second" are merely intended for a purposes of description and shall not be understood as an indication or implication of relative importance or implicit indication of a quantity of indicated technical features. Therefore, a feature limited by "first" or "second" may explicitly or implicitly include one or more features. In the descriptions of illustrated embodiments of the disclosure, unless otherwise specified, "a plurality of/multiple" means two or more.

In the description of the specification, the description with reference to the terms "one embodiment", "some embodiments", "illustrative embodiment", "example", "specific example", or "some examples", and the like, means that a specific feature, structure, material, or characteristic described in connection with the embodiment or example is included in at least one embodiment or example of the disclosure. In this specification, the schematic expressions of the above terms do not necessarily refer to the same embodiments or examples. Furthermore, the specific features, structures, materials or characteristics described may be combined in any one or more embodiments or examples in a suitable manner.

Although embodiments of disclosure have been illustrated and described above, it may be understood that above embodiments are just explanatory, and cannot be construed to limit the disclosure, for those skilled in the art, changes, alternatives, and modifications can be made to the embodiments without departing from the scope of the disclosure.

What is claimed is:

1. A display screen, comprising:

a substrate, wherein the substrate comprises a first area and a second area;

a plurality of first pixel units, wherein each of the plurality of first pixel units comprises a first light-emitting unit and a first driving circuit configured to drive the first light-emitting unit to emit light, the first light-emitting unit is disposed on the first driving circuit and arranged in the first area together with the first driving circuit;

a plurality of second pixel units, wherein each of the plurality of second pixel units comprises a second light-emitting unit, and the second light-emitting unit is arranged in the second area; and a second driving circuit, configured to drive the second light-emitting unit to emit light;

wherein an area of a projection of the first light-emitting unit on the substrate is smaller than an area of a projection of the second light-emitting unit on the substrate;

wherein the plurality of first pixel units are arranged in an array, a transverse spacing area is defined between the first pixel units of adjacent rows; and the display screen further comprises transverse electrical connection lines each disposed in the first area and extending along a row direction of the plurality of first pixel units, each transverse electrical connection line is connected with the first driving circuits of a row of the first pixel units, one of adjacent two transverse spacing areas is provided with two transverse electrical connection lines therein, and each transverse electrical connection line is located at an edge of the one of the adjacent two transverse spacing areas;

wherein the plurality of first pixel units comprises micro light-emitting diodes arranged at equal intervals in a column direction, each row of the micro light-emitting diodes have the transverse electrical connection line electrically connected thereto, adjacent two transverse electrical connection lines are set as one group and respectively serve as an upper transverse electrical connection line and a lower transverse electrical connection line, the upper transverse electrical connection line is arranged at a lower edge of one row of the micro light-emitting diodes, and the lower transverse electrical connection line is arranged at an upper edge of another row of the micro light-emitting diodes, the transverse spacing area between the transverse electrical connection lines of different groups is larger than the transverse spacing area between the transverse electrical connection lines of the same group.

2. The display screen as claimed in claim 1, wherein the display screen further comprises a first display area and a second display area, and a pixel density of the first display area is the same as a pixel density of the second display area.

3. The display screen as claimed in claim 2, wherein the first display area comprises the first area and the plurality of first pixel units, the second display area comprises the second area, the plurality of second pixel units and the second driving circuit, the second display area surrounds the first display area, and at least a part of an edge of the first display area abuts the second display area.

4. The display screen as claimed in claim 1, wherein a lifespan of the first light-emitting unit is longer than a lifespan of the second light-emitting unit.

5. The display screen as claimed in claim 1, wherein the first light-emitting unit comprises the micro light-emitting diode, and the second light-emitting unit comprises an organic light-emitting diode.

6. The display screen as claimed in claim 1, wherein the first light-emitting unit comprises micro light-emitting diodes of three colors respectively being a red micro light-emitting diode, a green micro light-emitting diode and a blue micro light-emitting diode.

7. The display screen as claimed in claim 1, wherein the projection of the first light-emitting unit on the substrate covers a projection of the first driving circuit on the substrate.

8. The display screen as claimed in claim 1, wherein each of the transverse electrical connection lines disposed in the first area is covered by a light absorption layer.

9. The display screen as claimed in claim 1, wherein a longitudinal spacing area is defined between the first pixel units of adjacent columns; and wherein the display screen further comprises longitudinal electrical connection lines each disposed in the first area and extending along a column direction of the plurality of first pixel units, and each longitudinal electrical connection line is connected with the first driving circuits of a column of the first pixel units and disposed in one of adjacent two longitudinal spacing areas.

10. The display screen as claimed in claim 9, wherein the plurality of first light-emitting units comprises first through third columns of micro light-emitting diodes respectively being a column of red micro light-emitting diodes, a column of green micro light-emitting diodes and a column of blue micro light-emitting diodes arranged in respective column directions, the first through third columns of micro light-emitting diodes are arranged vertically in parallel, and each column of micro light-emitting diodes in the first through third columns of micro light-emitting diodes have the longitudinal electrical connection line electrically connected thereto.

11. The display screen as claimed in claim 10, wherein the adjacent two longitudinal spacing areas are defined among the first through third columns of micro light-emitting diodes, a first one of the adjacent two longitudinal spacing areas is provided with two longitudinal electrical connection lines in parallel, a second one of the adjacent two longitudinal spacing areas is provided with no longitudinal electrical connection line.

12. An electronic device, comprising:

a display screen comprising a first display area and a second display area, wherein the second display area surrounds the first display area; and a photosensitive element, disposed below the first display area of the display screen;

wherein the first display area comprises a first area of a substrate and a plurality of first pixel units, each of the plurality of first pixel units comprises a first light-emitting unit and a first driving circuit configured to drive the first light-emitting unit to emit light, the first light-emitting unit is disposed on the first driving circuit and arranged in the first area together with the first driving circuit;

wherein the second display area comprises a second area of the substrate, a plurality of second pixel units and a second driving circuit, each of the plurality of second pixel units comprises a second light-emitting unit arranged in the second area, and the second driving circuit is configured to drive the second light-emitting unit to emit light;

wherein the plurality of first pixel units are arranged in an array including multiple columns, a longitudinal spacing area is defined between the first pixel units of adjacent columns; the display screen further comprises longitudinal electrical connection lines each disposed in the first area and extending along a column direction of the plurality of first pixel units, and each longitudinal electrical connection line is connected with a column of first pixel units; and for every two adjacent longitudinal spacing areas defined by the multiple columns of the first pixel units, one of the every two adjacent longitudinal spacing areas is provided with two longitudinal electrical connection lines in parallel, and another of the every two adjacent longitudinal spacing areas is provided with no longitudinal electrical connection line.

13. The electronic device as claimed in claim 12, wherein a transverse spacing area is defined between the first pixel units of adjacent rows, and the display screen further comprises transverse electrical connection lines each disposed in the first area and extending along a row direction of the plurality of first pixel units, each transverse electrical connection line is connected with the first driving circuits of a row of the first pixel units, one of adjacent two transverse spacing areas is provided with two transverse electrical connection lines therein, and each transverse electrical connection line is located at an edge of the one of the adjacent two transverse spacing areas;

wherein the plurality of first pixel units comprises micro light-emitting diodes arranged at equal intervals in a column direction, each row of the micro light-emitting diodes have the transverse electrical connection line electrically connected thereto, adjacent two transverse electrical connection lines are set as one group and respectively serve as an upper transverse electrical connection line and a lower transverse electrical connection line, the upper transverse electrical connection line is arranged at a lower edge of one row of the micro light-emitting diodes, and the lower transverse electrical connection line is arranged at an upper edge of another row of the micro light-emitting diodes, the transverse spacing area between the transverse electrical connection lines of different groups is larger than the transverse spacing area between the transverse electrical connection lines of the same group.

14. A method for manufacturing a display screen, comprising:

providing a substrate, wherein the substrate comprises a first area and a second area;

providing a plurality of first pixel units, wherein each of the plurality of first pixel units comprises a first light-emitting unit and a first driving circuit configured to drive the first light-emitting unit to emit light, and the first light-emitting unit is disposed on the first driving circuit;

transferring the first light-emitting unit together with the first driving circuit into the first area;

disposing a plurality of second pixel units in the second area, wherein each of the plurality of second pixel units comprises a second light-emitting unit, a second driving circuit is configured to drive the second light-emitting unit to emit light, and an area of a projection of the first light-emitting unit on the substrate is smaller than an area of a projection of the second light-emitting unit on the substrate; and encapsulating the plurality of second pixel units in an encapsulation layer;

wherein the plurality of first pixel units are arranged in an array including multiple rows, a transverse spacing area is defined between the first pixel units of adjacent rows; and the method further comprises:

providing, in the first area, transverse electrical connection lines each extending along a row direction of the plurality of first pixel units, wherein each transverse electrical connection line is connected with the first driving circuits of a row of the first pixel units, one of adjacent two transverse spacing areas is provided with two transverse electrical connection lines therein, and each transverse electrical connection line is located at an edge of the one of the adjacent two transverse spacing areas;

wherein the plurality of first pixel units comprises micro light-emitting diodes arranged at equal intervals in a column direction, each row of the micro light-emitting diodes have the transverse electrical connection line electrically connected thereto, adjacent two transverse electrical connection lines are set as one group and respectively serve as an upper transverse electrical connection line and a lower transverse electrical connection line, the upper transverse electrical connection line is arranged at a lower edge of one row of the micro light-emitting diodes, and the lower transverse electrical connection line is arranged at an upper edge of another row of the micro light-emitting diodes, the transverse spacing area between the transverse electrical connection lines of different groups is larger than the transverse spacing area between the transverse electrical connection lines of the same group.

15. The method as claimed in claim 14, wherein the display screen further comprises a first display area and a second display area, a pixel density of the first display area is the same as a pixel density of the second display area, and a lifespan of the first light-emitting unit is longer than a lifespan of the second light-emitting unit.

16. The method as claimed in claim 14, further comprising:

attaching a polarizer on the encapsulation layer.

17. The method as claimed in claim 14, wherein the plurality of first pixel units are provided through steps comprising:

providing a first wafer;

forming the first driving circuit on the first wafer;

forming first light-emitting units spaced apart from each other on the first driving circuit; and cutting the first wafer to obtain individual first pixel units.

18. The method as claimed in claim 17, wherein forming the first light-emitting units spaced apart from each other on the first driving circuit, comprises:

disposing a second wafer with a base on the first driving circuit;

removing the base; and forming the first light-emitting units on the second wafer.

19. The method as claimed in claim 18, wherein forming the first light-emitting units on the second wafer, comprises:

forming a plurality of intermediate bodies on the second wafer, wherein each of the plurality of intermediate bodies comprises a plurality of micro light-emitting diodes of same color; and performing color conversion on the plurality of micro light-emitting diodes of same color to obtain the first light-emitting unit, wherein the first light-emitting unit comprises a red micro light-emitting diode, a green micro light-emitting diode and a blue micro light-emitting diode.

20. The method as claimed in claim 14, wherein a longitudinal spacing area is defined between the first pixel units of adjacent columns, and the method further comprises:

providing, in the first area, longitudinal electrical connection lines each extending along a column direction of the plurality of first pixel units, and each longitudinal electrical connection line is connected with a column of first pixel units;

wherein for every two adjacent longitudinal spacing areas defined by multiple columns of the first pixel units, one of the every two adjacent longitudinal spacing areas is provided with two longitudinal electrical connection lines in parallel, and another of the every two adjacent longitudinal spacing areas is provided with no longitudinal electrical connection line.

* * * * *